United States Patent [19]

Bukowski, Jr.

[11] Patent Number: 4,948,992

[45] Date of Patent: Aug. 14, 1990

[54] STATIC METHOD TO NEGATE OFFSET VOLTAGES IN CMOS OPERATIONAL AMPLIFIERS

[75] Inventor: Eugene R. Bukowski, Jr., South Bend, Ind.

[73] Assignee: International Business Machines Corporation, Armonk, N.Y.

[21] Appl. No.: 265,113

[22] Filed: Oct. 31, 1988

[51] Int. Cl.$^5$ .......................... G06G 7/12; H03K 5/00
[52] U.S. Cl. .................................. 307/491; 307/493; 307/494; 307/520; 328/162; 328/165
[58] Field of Search ............... 307/491, 493, 494, 496, 307/497, 352, 353, 520; 328/151, 162, 165; 330/9, 107; 333/173

[56] References Cited

U.S. PATENT DOCUMENTS

| | | | |
|---|---|---|---|
| 3,050,673 | 8/1962 | Widmer | 307/353 |
| 4,365,204 | 12/1982 | Hague | 328/262 |
| 4,439,693 | 3/1984 | Lucas et al. | 307/353 |
| 4,560,890 | 12/1985 | Masuda et al. | 328/151 |
| 4,604,584 | 8/1986 | Kelley | 307/353 |
| 4,769,612 | 9/1988 | Tamakoshi et al. | 328/151 |

OTHER PUBLICATIONS

R. Poujois et al., "Low-Level MOS Transistor Amplifier Using Storage Techniques", IEEE International Solid-State Circuits Conference, Feb. 1973, pp. 152–153 and 216–217.
Gray et al., "MOS Operational Amplifier Design—A Tutorial Overview", IEEE Journal of Solid State Circuits, vol. SC-17, No. 6, Dec. 1982, pp. 969–982.
McGeary et al., "All—MOS Charge Redistribution Analog-to-Digital Conversion Techniques—Part 1", IEEE Journal of Solid State Circuits, vol. SC-10, No. 6, Dec. 1975, pp. 371–379.
Schade, Jr., "BiMOS Micropower IC's", IEEE Journal of Solid State Circuits, vol. SC-13, No. 6, Dec. 1978, pp. 791–798.
Schade, Jr., "A Low-Voltage BiMOS Op Amp", IEEE Journal of Solid State Circuits, vol. SC-16, No. 6, Dec. 1981, pp. 661–668.

Primary Examiner—Stanley D. Miller
Assistant Examiner—Trong Quang Phan
Attorney, Agent, or Firm—Joscelyn G. Cockburn

[57] ABSTRACT

Disclosed is a generator and method for using the generator to negate offset voltages in operational amplifiers. The generator includes an operational amplifier (op amp) whose input stage includes a current source coupled to a differential pair of input devices. The physical characteristics of the devices are such that an intentional offset voltage greater than the normal op amp offset voltage is provided in the input stage. The output terminal of the generator op amp is connected to the substrate terminal of one of the input devices. The offset voltages of other op amps can be negated by interconnecting the substrate terminal of one device in each input differential pair to the output terminal of the generator op amp and creating an intentional offset voltage in the input differential pair of each op amp.

11 Claims, 3 Drawing Sheets

STATIC METHOD TO NEGATE OFFSET VOLTAGES IN CMOS OPERATIONAL AMPLIFIERS

BACKGROUND OF THE INVENTION

1. Field of the Invention

The present invention relates to operational amplifiers in general and more particularly to apparatus and methods which negate the offset voltages associated with said amplifiers.

2. Prior Art

Operational amplifiers may be used for a wide variety of purposes, such as those in which high gain amplification is required. A conventional high gain operational amplifier consists of at least an input and an output stage. A signal provided at the input stage is amplified and outputted at the output stage.

A significant disadvantage that plagues all operational amplifiers is voltage offset. This offset is present even in the absence of an input signal. As set forth in an article entitled "MOS Operational Amplifier Design," a tutorial overview, by Paul R. Gray et al, IEEE Journal Solid State Circuits, Vol. SC-17, pp. 969–982, Dec. 1982, the offset voltage of an op amp is consisted of two components, random offset and systematic offset. Random offset results from mismatches due to process variations in supposedly identical pairs of devices. In MOSFET op amps random offset is primarily due to threshold voltage mismatch. Threshold voltage mismatch is a function of process cleanliness and uniformity. Similarly, capacitance mismatch between supposedly identical silicon gate MOS capacitors is also a function of process variations. Systematic offset is caused by mismatches between cascaded stages of an op. amp. and is present even with perfect device matching.

For precision applications, it is desirable to cancel all offset voltages. The prior art describes several techniques for cancelling op. amp. offset voltages. Some of these techniques are set forth in the following articles: H. Schmidt, "Electronic Analog/Digital Conversions," pages 387–389 New York, Van NostrandReinhold, 1970, R. Poujors, B. Boylac, D. Barbier and J. M. Ittel, "Low Level MOS Transistor Amplifier Using Storage Techniques," ISSCC Dig. Tech. Papers, Feb. 1973 and U.S. Pat. No. 4,439,693. Primarily, these methods used switched capacitor circuits.

Usually the offset voltage is stored during one clock cycle and subtracted during another clock cycle. Even though this technique works well for its intended purpose, its main drawback is that it requires clocks and sampling techniques to cancel the offset. As a result, the switched capacitor approach does not allow the op amp to amplify signals approaching the frequency limit of the technology. In addition, the switched capacitor technique is a sampled one and does not allow for continuous amplification. Also switched capacitor circuits consume large amounts of area, and the clock signals can introduce noise into the signal.

As can be seen from the above description, these techniques are dynamic. Dynamic techniques can be costly and undesirable for some applications. Thus, there is a need for a static method to eliminate offset voltages in CMOS operational amplifiers.

Another prior art method which is used to negate offset voltage is the so-called "common centroid geometries." This method is particularly suited for matching silicon-gate MOS capacitors and is described by Paul R. Gray, James L. McCreary, "ALL-MOS Charge Redistribution Analog-to-Digital Conversion Techniques - Part 1," IEEE Solid State Circuits, Vol. SC-10, pp. 371–379, Dec. 1975. However, published data (see O. H. Shade, Jr. "BIMOS Micropower Integrated Circuits," IEEE Solid-State Circuits, Vol. SC-13, pp. 791–7998, Dec. 1978 and O. H. Shade, Jr. and E. J. Kramner, "A Low-Voltage BIMOS Op Amp," IEEE SolidState Circuits, Vol. SC-16, pp. 661–668, Dec. 1981) seems to indicate that large-geometry common-centroid matched transistors are also capable of significantly improving transistor mismatch distributions. The large geometries effectively eliminate the second order effects of process variations. Hence, process variations can be approximated as first order gradients within a physically close area.

Even though the common centroid geometries work well with two-terminal capacitors, using it with three-terminal transistors can require intricate physical designs. Large common centroid geometries consume large amounts of area. In addition, the common centroid method does not compensate for systematic offset. Finally, prior art techniques that compensate for systematic offsets require sacrificing low noise and best frequency response under capacitive loading.

SUMMARY OF THE INVENTION

It is a general object of the present invention to provide a static method and apparatus which compensates for offsetting voltage in an op amp.

The apparatus includes an op amp biased to virtual ground and a negative feedback conductor. The op amp includes an input stage having a pair of differential FET devices with the substrate electrode of one of the devices connected to the conductor, and an intentional offset voltage ($V_{osi}$) having a magnitude greater than that of the op amp normal offset voltage ($V_{os}$) is placed within the input stage. The polarity of the intentional offset voltage is opposite to the polarity of the op amp. The apparatus provides a compensating signal which can be used to negate the offset voltage of other op amps.

In one feature of the invention $V_{osi}$ is generated by dissimilar paired differential devices.

The foregoing and other objects, features and advantages of this invention will be more fully described in the accompanying drawings.

DESCRIPTION OF THE PREFERRED EMBODIMENT

Figure 1:
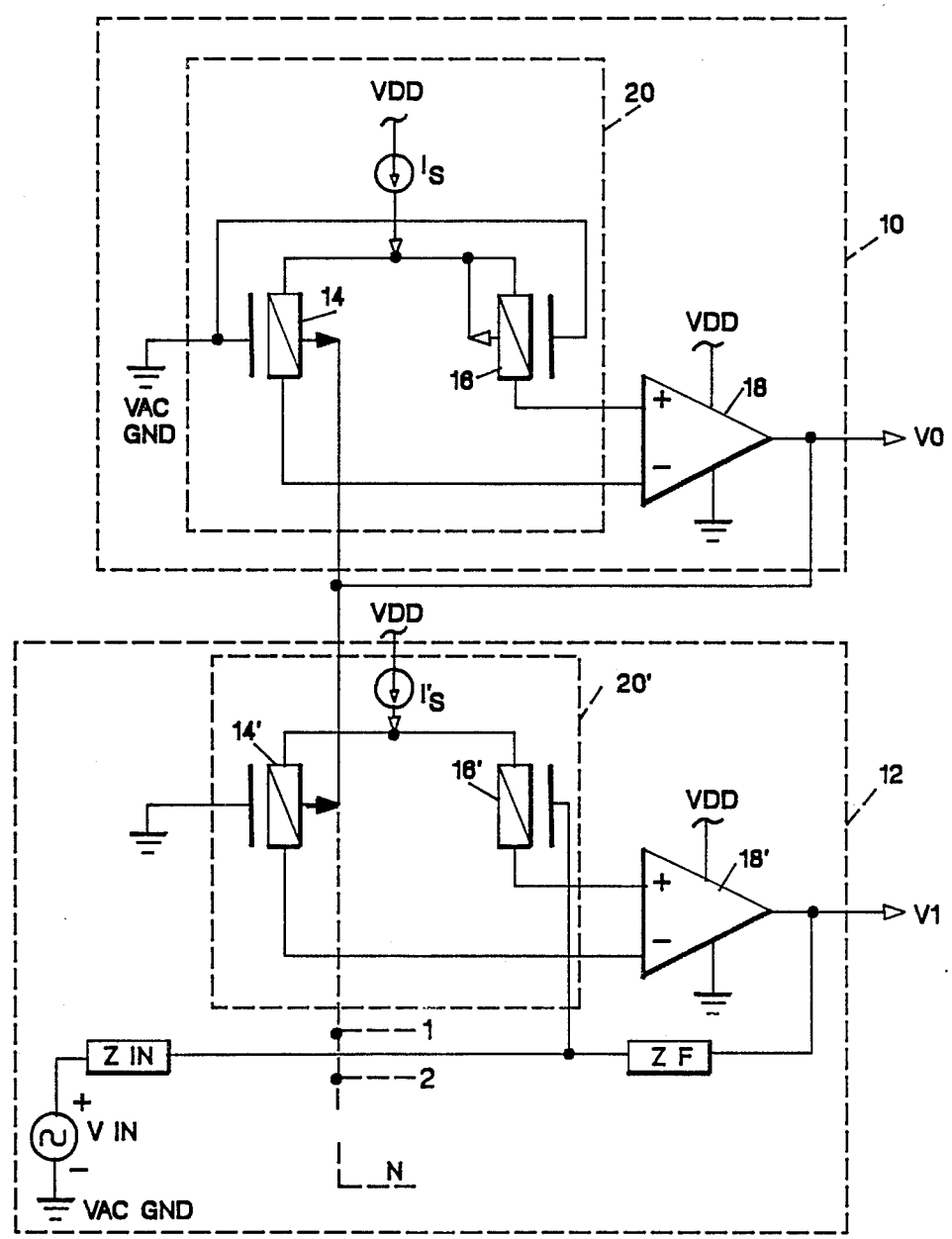
FIG. 1 is a schematic of a circuit arrangement that generates a control voltage (Vo) which is used to compensate offsetting voltages in one or more operational amplifiers.

FIG. 1 shows a circuit arrangement which includes the teachings of the present invention. The circuit arrangement is comprised of a voltage generator 10 connected to circuit arrangement 12. As will be described subsequently, depending on the circuitries which are used to implement $Z_{in}$ and $Z_f$ circuit arrangement 12 can be made into a sample and hold circuit or the like. The dotted lines 1, 2, ... N in FIG. 1 indicates that additional circuit arrangements such as 12 can be connected to voltage generator 10. Voltage generator 10 generates control voltage Vo which drives FET device 14' and similar connected devices so that the threshold voltages of 14' and said similar connected FET devices cancel (i.e., negate) the offset voltage which is associated with circuit arrangement 12.

The voltage generator 10 is an improved operational amplifier which includes a partial operational amplifier (op amp) 18 and a partial differential input stage 20 that is adjusted in accordance with the teaching of the present invention. Partial operational amplifier 18 can include a plurality of amplifying stages interconnected in a conventional topology. Since multistage operational amplifiers are well known, applicant elects to show the other stages of the op amp that follow input stage 20 as a single block 18. Since the loading of differential input pairs within differential amplifiers are well known, the applicant also elects to show the load devices of the input stage of voltage generator 10 imbedded in block 18. Amplifier 18 includes a power terminal which is connected to a power supply Vdd, a control terminal which is connected to a ground potential and an output terminal which provides the output control voltage (Vo). Amplifier 18 has a negative input terminal and a positive input terminal. The input stage 20 comprises of a current source $I_s$ which is connected to power supply Vdd. Preferably, current source $I_s$ is formed from P-channel devices or the like configured in a conventional topology. The differential input stage includes FET devices 14 and 16 which are connected in parallel and in series with current source $I_s$. In the preferred embodiment of this invention the FET devices are P channel enhancement mode devices. P-channel device 14 has its substrate electrode (identified by an arrow) connected to the output (Vo) of amplifier 18. The drain electrode of FET device 14 is connected to the negative input terminal of amplifier 18. The source electrode of FET device 14 is connected to $I_s$ and its gate electrode is connected to a bias voltage $V_{ac}$ ground. Similarly, FET device 16 has its gate electrode connected to $V_{ac}$ ground. The substrate electrode and the source electrode of FET device 16 are connected to $I_s$ and the drain electrode is connected to the positive terminal of amplifier 18. Preferably, P-channel devices 14 and 16 are matched pairs located in separate N-wells. The devices are fabricated so that the below-listed equation 1 is satisfied.

(1) $V_{osi} > |V_{os}|_{max}$ where $V_{osi}$ is an intentionally introduced offset voltage and $V_{os}$ represents the normal offset voltage in voltage generator and op amp 10.

There exists a variety of different ways in which $V_{osi}$ can be created. In the preferred embodiment of this invention the geometries of devices 14 and 16 are used to provide Vosi. In particular, the width-to-length ratio of FET device 14 is greater than that of FET device 16. As a result of this relationship, the introduced offset $V_{osi}$ is summed with the natural offset voltage $V_{os}$ which is present in voltage generator and op amp 10 such that the polarity of the net offset voltage in 10 is always opposite the polarity of the input terminals to 10 with respect to Vo. This eliminates the possibility of latch-up in device 14 caused by a net offset voltage with the same polarity as the input terminals to 10 with respect to Vo. By connecting the substrate terminal of FET device 14 to the output of amplifier 18, the threshold voltage (Vt) of FET device 14 changes (i.e., adjusts) to cancel the net offset voltage caused by the intentional induced voltage $V_{osi}$ and the natural offset voltage Vos. The net result is that the output voltage $V_o$ is free from any offset voltage and is used to negate offset voltages in similar type operational amplifiers.

Still referring to FIG. 1, the control voltage Vo is used to negate the offset voltage of the op amp comprised of 18' and 20'. Preferably, the said op amp has characteristics similar to the op amp comprised of 18 and 20 and is positioned in close proximity thereto. Preferably, CMOS technology is used for generating the op amps. Of course, other types of technologies could be used for designing the op amps without deviating from the scope or spirit of the present invention. The circuit arrangement 12 includes partial op amp 18' and partial input stage 20'. The input stage is comprised of current source $I_s'$ and FET devices 14' and 16'. The relationship between these components is similar to the relationship previously described for like components in input stage 20. Zin and Zf represent input and feedback circuitry respectively. The combination of Zin and Zf control the gain and the frequency response characteristics of circuit arrangement 12. Since the use of input and feedback circuitry to control the gain and frequency response of circuit arrangements using op amps is well known, applicant elects to show the input and feedback circuitry as single blocks Zin and Zf, respectively. Vin represents the input signal which is coupled into the amplifier. The input signal (Vin) is amplified and is outputted as V1. Depending on the circuitry which is selected for Zin and Zf, the circuit arrangement 12 can function as a sample and hold circuit. For example, if circuit arrangement 12 is a sample and hold circuit, then Zin and Zf are comprised of switched capacitors (capacitor elements switched using transistors and clock signals). An example of capacitive circuits which could be used for Zin and Zf are set forth in FIG. 7 of copending application Ser. No. 208327 filed June 17, 1988, and assigned to the assignee of the present invention. The subject application is incorporated herein by reference.

Figure 2:
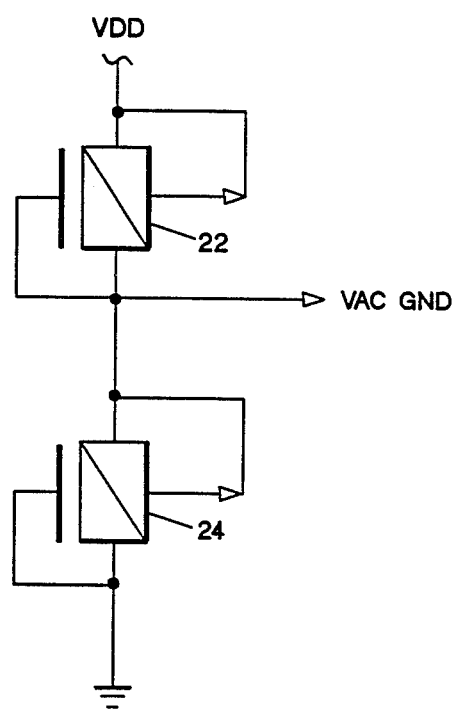
FIG. 2 shows a circuit arrangement for generating an AC ground signal.

FIG. 2 shows a circuit arrangement which can be used to provide bias voltage $V_{ac}$ ground to the respective terminals of FIG. 1. The circuit arrangement includes two P-channel transistors 22 and 24 connected in series between Vdd and ground. Each has its gate electrode connected to its drain electrode. Each has its substrate electrode connected to its source electrode, and each has identical geometry. With this configuration the output is $V_{ac}$ground $= Vdd/2$.

Figure 3:
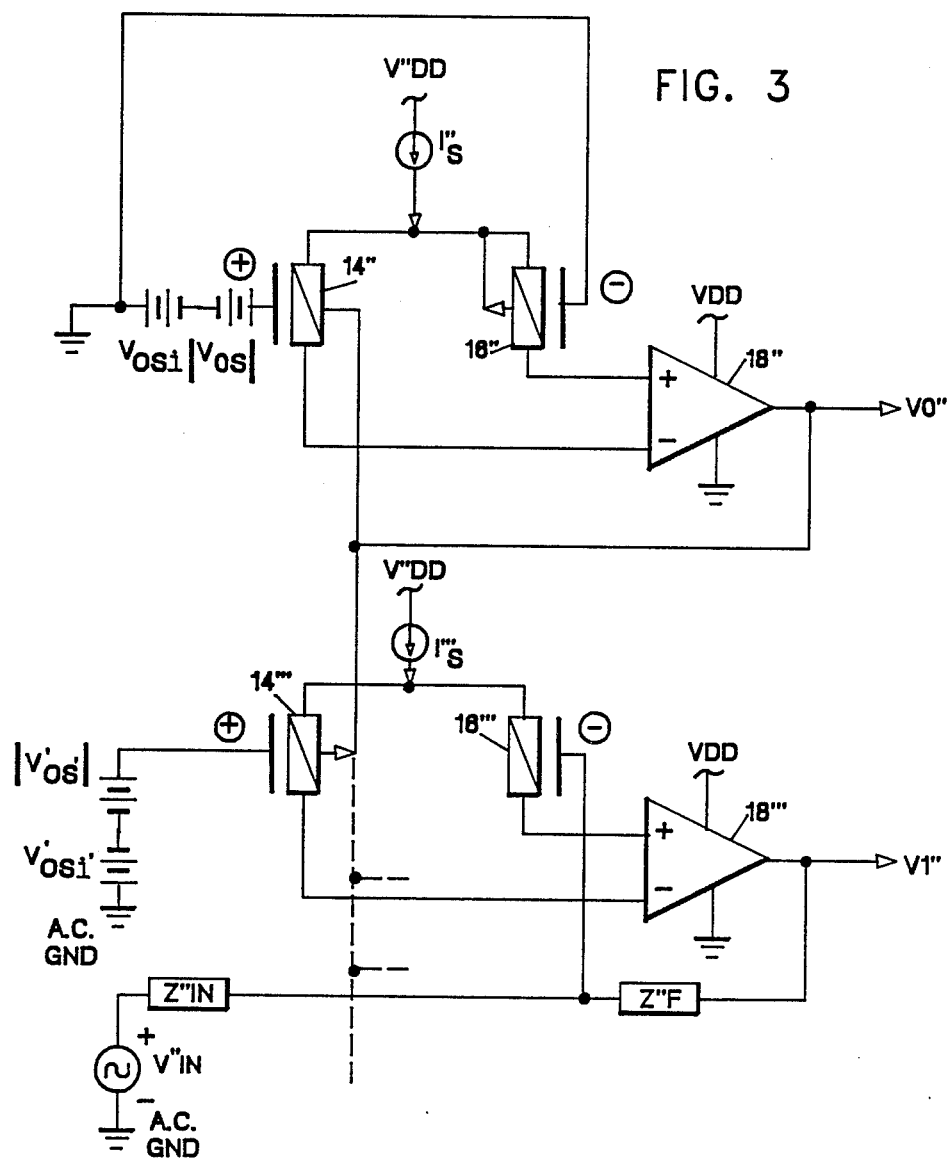
FIG. 3 shows an equivalent circuit for FIG. 1 circuit arrangements. It is helpful in understanding the present invention.

FIG. 3 shows an equivalent circuit for FIG. 1. This equivalent circuit is helpful in understanding the operation of the invention. For simplicity, components in FIG. 3 which are identical to components in FIGS. 1 and 2 are identified by common alphanumeric characters with double and triple prime notations indicating that these components are in FIG. 3. As is seen in FIG. 3, the partial op amps 18" and 18''' are biased by a feedback configuration and an a.c. ground voltage (Vac gnd).

$Z''_{IN}$ and $Z''_F$ perform the same functions as previously described Zin and Zf. Of particular interest are Vosi, Vos, V'osi' and V'os'. Vosi and V'osi' represent offset voltages which have been intentionally introduced in the input stages of op amps 18" and 18'''. Likewise, Vos and V'os' represent the maximum naturally occurring equivalent offset voltage. As stated previously, the geometries of the input differential pair devices (such as 14", 16", etc.) can be selected to provide a desired intentionally introduced offset voltage. As stated previously, input transistors 14" and 14'" each has its own isolated N-well. The N-well (bulk) terminals are externally biased to adjustable voltage Vo" which is always less than the common source voltages of the transistors. The threshold voltages of 14", 14'", etc. are, therefore, a function of Vo. A mathematical expression for the relationship is set forth in Equation 2 below.

(2) $Vt = Vt0 + K1[(\phi - Vbs)^{\frac{1}{2}} - (\phi)^{\frac{1}{2}}]$ where $V_{bs}$ is the potential between the bulk (substrate) and source of the device, K1 is a body effect coefficient of Vt, $\phi$ is a surface potential of strong inversion, Vt represents the device threshold voltage and Vto represents the device natural threshold voltage.

It is claimed that if the polarity of the total net offset voltage comprised of $V_{os}$ and $V_{osi}$ is opposite the polarity of the input terminals to the op amp with respect to Vo (i.e., if Vosi> |Vos|), there exists some voltage Vo that can shift the threshold voltage by exactly the said total net offset voltage and effectively cancel or negate all offset voltage in the op amp. If the total net offset voltage was allowed to have the same polarity as the said input terminals (i.e., if $V_{osi}$< |Vos|), then it would be required that Vt would have to be shifted below Vto in order to negate the total net offset voltage. This is not possible with the constraint that the N-well bulk or substrate voltage must always be less than or equal to the common source voltage in order to avoid latch-up. To solve this problem, more offset has been introduced intentionally into the op amp. This voltage is identified as $V_{osi}$ in FIG. 3. $V_{osi}$ is always a positive value biased as shown in FIG. 3, and it is always greater than or equal to the magnitude of the maximum naturally-occurring equivalent offset voltage (Vos). This maximum equivalent offset voltage can be determined from the process used in manufacturing the devices. Thus, $V_{osi}$ is greater than the absolute value of $V_{os}$ maximum. As described above, this $V_{osi}$ is created by selecting the proper geometry of differential pair input devices (such as 14", 16", etc.).

Still referring to FIG. 3, since the positive input terminals of the op amps are shorted to a common a.c. ground input, the equivalent offset voltages are shown in series with the positive input terminal. The op amp that includes amplifier 18" is configured such that its output provides negative feedback to the N-well (bulk) terminal of transistor 14". Therefore, the quiescent operating point of the op amp that includes amplifier 18" is when Vo" causes a Vbs that results in a shift in the threshold voltage of 14" exactly equal to the sum of $V_{osi}$ and $V_{os}$. The output voltage Vo" can then be made available to the N-well (bulk) terminal with positive input transistor (such as 14'", etc.) of another identical copy and physically close op amp that includes amplifier 18'" in order to cause the same negating effect. The offset voltage of the said op amp is approximately negated and thus its output voltage V1 is not affected by the offset voltage present in the op amp. This, of course, assumes that physically close op amps have identical offset voltages. It is obvious that $V_{osi}$ is identical for both op amps containing amplifiers 18" and 18'" since it is the result of design and the design of the two op amps is identical. It is also obvious that the systematic component of $V_{os}$ is identical for both op amps since it is also the result of design. Although the remainder of the offset is random within any given sample op amp, this offset approximately tracks systematically between both op amps containing amplifiers 18" and 18'". This concludes the description of the present invention which sets forth a new static device and method that eliminates total equivalent offset voltages in CMOS operational amplifiers.

I claim:

1. A circuit arrangement for adjusting offset voltages associated with operational amplifiers, said circuit arrangement comprising in combination:
    a first operational amplifier having an output;
    a first input stage coupled to said operational amplifier; said input stage having a pair of FET devices for providing a first offset voltage having a magnitude which is greater than the magnitude of a natural offset voltage of said operational amplifier; and
    a connecting means for coupling the output of said operational amplifier to a substrate electrode of one of said FET devices so that the algebraic sum of the first offset voltage, threshold voltage of said one of said FET devices and the natural offset voltage is essentially zero.

2. The circuit arrangement set forth in claim 1 further including a current source coupled to the first input stage; and
    a power supply coupled to said current source.

3. The circuit arrangement of claim 2 further including a circuit network for providing an AC ground signal coupled to said input stage.

4. The circuit arrangement of claim 1 wherein the FET devices include P-channel enhancement mode devices.

5. A circuit arrangement for adjusting offset voltages associated with operational amplifiers, said circuit arrangement comprising in combination:
    a first operational amplifier:
    a first input stage coupled to said operational amplifier; said input stage providing a first offset voltage having a magnitude which is greater than the magnitude of a natural offset voltage of said operational amplifier;
    a control means coupled to said input stage said control means providing a control voltage so that the algebraic sum of the first offset voltage, the control voltage and the natural offset voltage is essentially zero;
    a second operational amplifier having an output terminal, a positive and negative input terminals;
    a current source;
    a first FET device coupled to the negative input terminal and the current source;
    a second FET device coupled to the current source and arranged in parallel with the first FET;
    a first conductor coupling the second FET device with the output terminal;
    a second conductor interconnecting said second FET device to the positive input terminal; and
    a third conductor interconnecting a substrate electrode of said first FET device to the first operational amplifier.

6. The circuit arrangement of claim 5 further including means for providing an AC ground signal coupled to said first FET device.

7. A circuit arrangement for generating a control signal for negating offset voltages associated with CMOS operational amplifiers comprising:
    an operational amplifier which generates the control voltage;

said operational amplifier having an output node, a negative input node and a positive input node;

a current source;

a first FET device having a source electrode connected to the current source and a drain electrode connected to the negative input node and a substrate electrode connected to the output node;

a second FET device placed in parallel with the first FET device, said second FET device having a substrate and source electrode connected to the current source and a drain electrode connected to the positive input node; and a circuit network for biasing the first FET device and second FET device coupled to the gate electrode of said first and second FET device.

8. The circuit arrangement of claim 7 further including a power supply coupled to said current source.

9. An improved sample-and-hold circuit with zero output offset voltage comprising; a first operational amplifier having an output terminal and an input stage which includes a pair of differential FET devices wherein a voltage generator means includes a second operational amplifier having an output node and an input stage including a current source, a first FET device and a second FET device connected in parallel to each other and in series to the current source; and a negative feedback loop interconnecting the output terminal to a substrate electrode of the first FET device and the substrate electrode of one of a pair of differential FET devices.

10. The improved sample and hold circuit of claim 9 wherein the FET devices include P-channel enhancement mode devices.

11. The improved sample and hold circuit of claim 9 wherein geometric characteristics of the first FET device and the second FET devices are such that $Vosi > |Vos|max$ where $Vosi$ is an intentionally introduced offset voltage and $Vos$ represents normal offset voltage of the second operational amplifier.

* * * * *